United States Patent [19]

Wallraff

[11] Patent Number: 4,817,199
[45] Date of Patent: Mar. 28, 1989

[54] PHASE LOCKED LOOP HAVING REDUCED RESPONSE TIME

[75] Inventor: Robert W. Wallraff, Marion, Iowa

[73] Assignee: Rockwell International Corporation, El Segundo, Calif.

[21] Appl. No.: 74,756

[22] Filed: Jul. 17, 1987

[51] Int. Cl.$^4$ .................... H03B 27/00; H03D 3/24
[52] U.S. Cl. ................................ 455/260; 455/264; 375/120; 331/55
[58] Field of Search ............... 455/260–265, 455/316, 317, 132, 139–141, 136; 331/4, 11, 2, 55, 25, 16, 132, DIG. 2; 375/111, 81, 119, 120

[56] References Cited

U.S. PATENT DOCUMENTS

| | | |
|---|---|---|
| 3,921,095 | 11/1975 | Chu . |
| 4,005,479 | 1/1977 | Hunnicutt et al. . |
| 4,270,210 | 5/1981 | Tan et al. ........................ 455/132 |
| 4,330,758 | 5/1982 | Swisher . |
| 4,406,017 | 9/1983 | Takahashi ....................... 455/139 |
| 4,451,930 | 5/1984 | Chapman et al. ............... 455/265 |
| 4,494,079 | 1/1985 | Light . |
| 4,607,393 | 8/1986 | Nolde et al. .................... 455/260 |
| 4,634,998 | 1/1987 | Crawford . |

FOREIGN PATENT DOCUMENTS 59-12442 1/1984 Japan .
59-22448 2/1984 Japan .

Primary Examiner—Robert L. Griffin
Assistant Examiner—Curtis Kuntz
Attorney, Agent, or Firm—M. Lee Murrah; V. Lawrence Sewell; H. Fredrick Hamann

[57] ABSTRACT

Apparatus and method for reducing the response time for changing a phase locked loop from one frequency to another in which a condition indicative of a frequency change is detected and the conditions in the phase locked loop are changed in response thereto. Specifically, the counts in the loop divider are reset to a predetermined count and an in-phase condition is simulated in the loop phase detector, thereby creating the conditions that are necessary for the phase locked loop to produce the new frequency without the time consuming incremental frequency adjustments that are normally required.

4 Claims, 3 Drawing Sheets

PHASE LOCKED LOOP HAVING REDUCED RESPONSE TIME

BACKGROUND OF THE INVENTION

The invention relates to new and useful improvements in phase-locked-loops, and more particularly to such phase-locked-loops used in radio frequency systems.

Phase-locked-loops (PLL) are commonly used in radio frequency circuits to produce a precise, stable frequency. The basic elements of a PLL include a voltage controlled oscillator (VCO) for producing an output signal having a controlled frequency; a feedback loop containing a frequency divider; a phase detector for comparing the phase of the frequency-divided VCO output signal with that of a predetermined, stable frequency standard and producing an error signal representing the detected phase difference; a reference divider; and a loop filter for filtering the error signal and coupling it to the VCO to controllably adjust the output signal's frequency.

One of the problems inherent in PLL's is slow "lock-in" when a new frequency is selected. When the frequency is changed as is commonly done by changing the divisor in the loop frequency divider, the phase detector is presented a phase difference which must be resolved by changing the frequency of the VCO. The PLL does so by incrementally changing its frequency until the phase error at the phase detector is eliminated and a new stable frequency output is attained. Depending upon the design of the VCO, the component values in the loop filter, and the frequency of operation, this can take anywhere from parts of a second to several minutes. While this lock-in delay can be worked around in some applications, even though undesirable, it is totally unacceptable in other applications. A number of approaches have been tried to reduce the lock-in time, but to date none has proven to be adequate.

It is therefore an object of the present invention to provide a phase-locked-loop having a significantly reduced lock-in delay.

SUMMARY OF THE INVENTION

The present invention achieves these and other objects by detecting an indication of frequency change and resetting conditions in the phase locked loop. This is done by resetting the counts in phase-locked-loop dividers to a predetermined count indicative of the new frequency and by simulating an in-phase condition in the loop phase detector.

BRIEF DESCRIPTION OF THE DRAWINGS

The invention may be more fully understood by reading the following description of a preferred embodiment of the invention in conjunction with the appended drawings wherein.

DETAILED DESCRIPTION OF A PREFERRED EMBODIMENT

Figure 1:
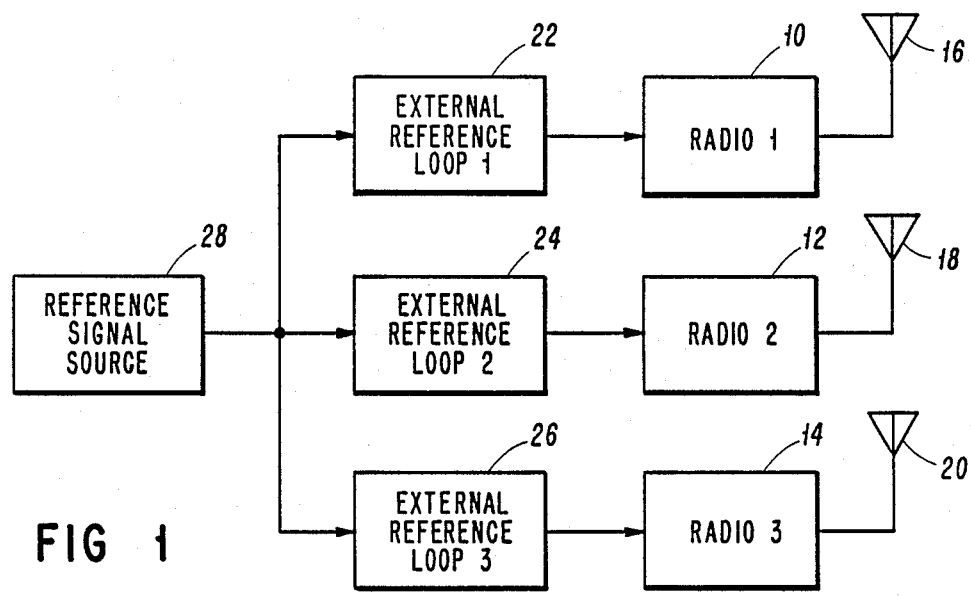
FIG. 1 ia a block diagram of an externally-synchronized, multiple radio system in which one embodiment of the present invention may be employed.

The invention may be used in an externally-synchronized, multiple radio system as illustrated in FIG. 1. For various reasons it may be desirable to synchronize the operation of several radio transceivers such as radios 10, 12, and 14. Each of radios 10, 12, and 14, is shown with an accompanying antenna 16, 18, and 20, respectively. Each of the radios has in communication therewith on the input side an associated external reference loop 22, 24, and 26, respectively, in accordance with the present invention. Although external reference loops 22, 24, and 26 are shown separately from radios 10, 12, and 14, they are preferably a part of the circuitry of the respective radios. External reference loops 22, 24, and 26 are constructed as supplemental to the normal frequency determining oscillators in the three radios and operate in replacement of the normal frequency determining oscillators only when connected to an external reference signal source, such as reference signal source 28. Thus, when it is desired that radios 10, 12, and 14 operate in frequency synchronicity, reference signal source 28 is connected to all three radios through external reference loops 22, 24, and 26. When this connection is made, the respective external reference loops are switched into the radio circuits and become the frequency determining PLL for the radios, and they thus operate in accordance with the common frequency standard provided by reference signal source 28.

In an alternative embodiment not shown, it may be desirable to connect a single radio to an external reference signal source. This would normally be done when the internal reference oscillator or other frequency determining device is not of the required accuracy for a particular application and an external source of greater accuracy is needed.

Figure 2:
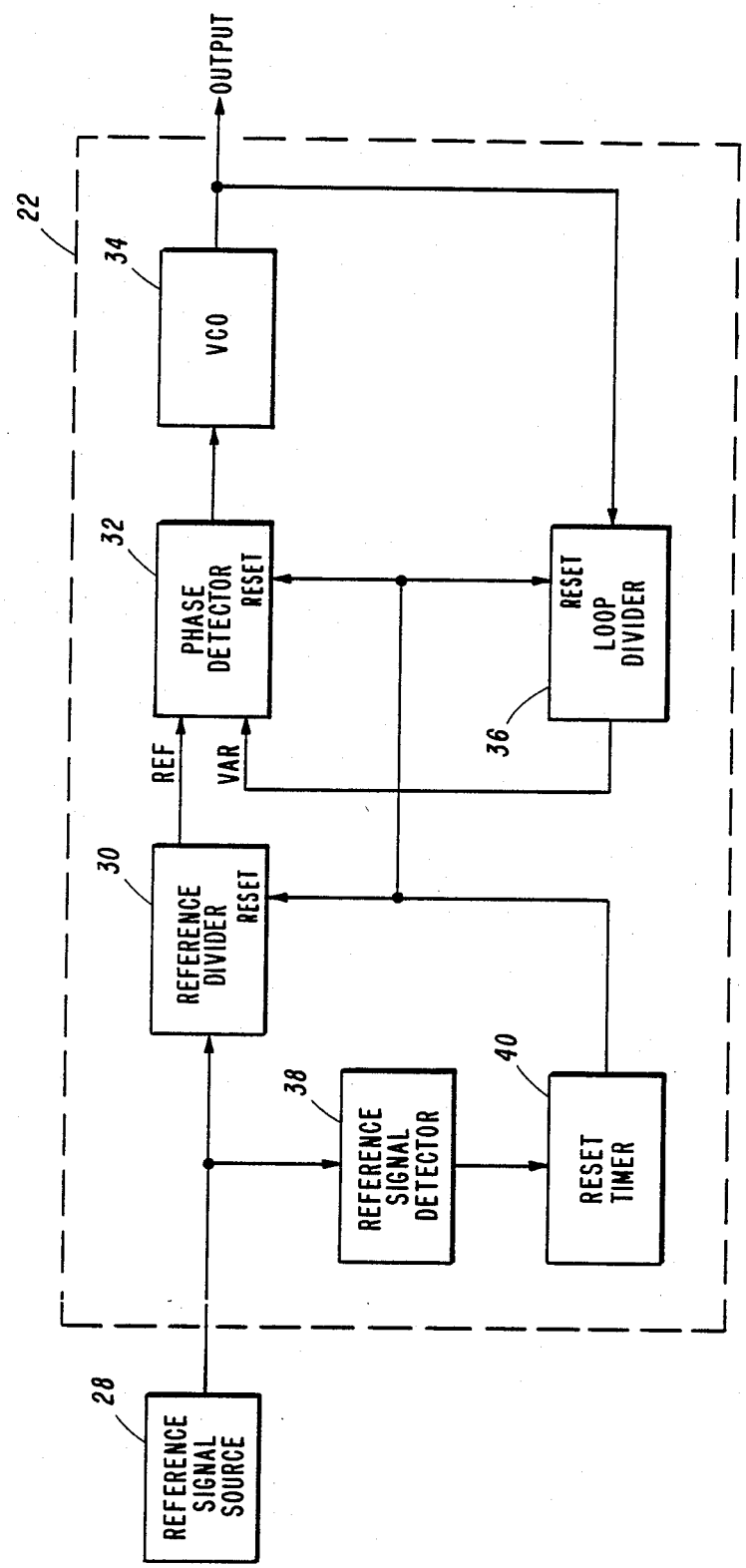
FIG. 2 is a block diagram of an embodiment of the present invention which may be used in the system of FIG. 1.

Referring to FIG. 2, one external reference loop 22 of the type shown in FIG. 1 is shown in greater detail along with reference signal source 28. The output of reference signal source 28 is coupled to a reference divider 30 whose output is coupled to the reference input (REF) of a phase detector 32. The output of phase detector 32 is coupled to a voltage controlled oscillator 34 whose output is made available for external uses such as in the frequency determining circuitry of radio 10 as described in FIG. 1. The output is also coupled to a loop divider 36 whose output is in turn coupled to the variable input (VAR) of phase detector 32. A loop filter may be used between phase detector 32 and VCO 34, although for the sake of simplicity, one is not shown in FIG. 2.

The output of reference signal source 28 is also coupled to a reference signal detector 38 which drives a reset timer 40. The output of reset timer 40 is applied to the reset (RESET) inputs of reference divider 30, loop divider 36, and phase detector 32.

In the operation of the circuit of FIG. 2, the reference signal source 28 is initially assumed not to be connected to external reference loop 22. In such condition there is no REF signal for phase detector 32 to compare against, and VCO 34 thus provides no useful output signal. Under these circumstances the normal frequency determining oscillator in radio 10 is in operation.

When it is desired to have an external reference frequency standard, reference signal source 28 is connected to external reference loop 22, and operation of loop 22 begins. In one portion of the startup of loop 22, the frequency of reference signal source 28 is divided by reference divider 30 and applied to the REF input of phase detector 32. The phase of the REF signal is compared to the phase of the initial signal at the VAR input of phase detector 32, and an error voltage representative of the phase difference is applied to VCO 34. VCO 34 produces an output signal having a frequency determined by the magnitude of the error voltage and applies this signal to loop divider 36 which divides the frequency down to frequency compatible with the frequency produced by reference divider 30 and applies the resultant signal to the VAR input of phase detector 32. As is well-known, phase detector 32 then produces a new error signal which changes the VCO output frequency. After many feedback cycles, the frequency of the VCO changes such that the phase difference between the REF and VAR signals at the input of phase detector 32 is zero.

Concurrently, reference signal detector 38 senses the presence of the reference signal and sends a reset signal to reference divider 30, loop divider 36, and phase detector 32. The reset signal is held by reset timer 40 for a predetermined length of time to permit the the loop components to stabilize their operation after startup. The reset signal to reference divider 30 and loop divider 36 resets the count in each divider to zero, thereby insuring that their respective outputs (i.e., REF and VAR) provide a pulse to phase detector 32 at the same time and are thus in phase.

Due to the characteristics of a Type 2 phase detector, phase detector 32 will not be able to determine whether there is a zero radian or a 2 pi radian phase difference between the REF and VAR signals when they are concurrent in time. For this reason a reset (or preset) signal is also sent to phase detector 32 to instruct it that the phase difference is zero degrees.

Figure 3:
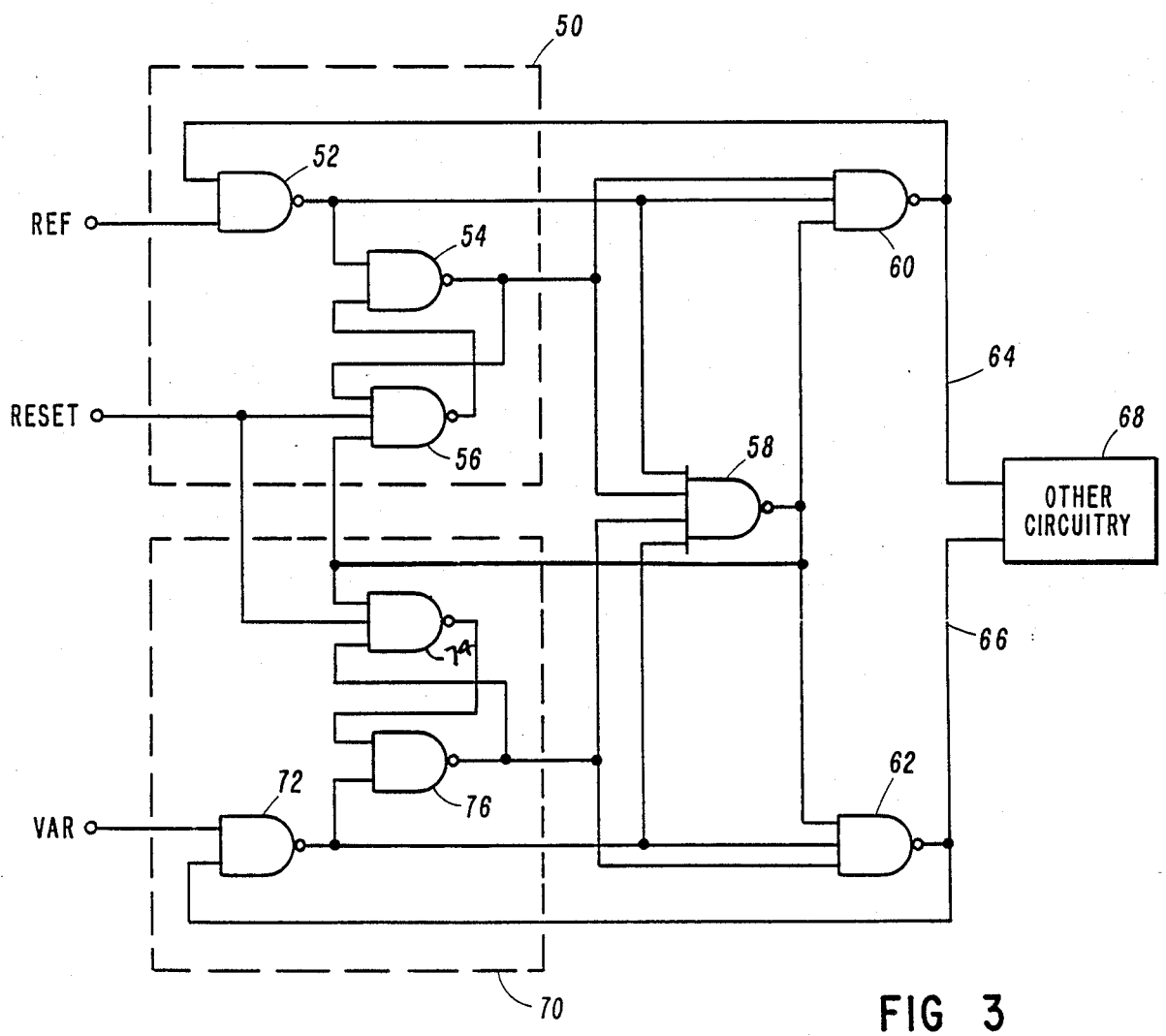
FIG. 3 is a circuit diagram of a Type 2 phase detector which may be used in the embodiment of FIG. 2 as well as other embodiments of the invention.

Referring to FIG. 3, a Type 2 phase detector is shown. The construction and operation of such a detector is well-known in the art and will not be repeated here. Suffice it to say that circuit portion comprising interconnected gates 52, 54, and 56 are configured to detect the presence of a REF pulse and to provide an output indicative thereof to gates 58 and 60. Likewise, circuit portion 70 comprising interconnected gates 72, 74, and 76 are configured to detect the presence of a VAR pulse and to provide an output indicative thereof to gates 58 and 62. If a REF pulse is detected before a VAR pulse, a pulse is outputted by gate 60 on line 64 to other circuitry 68. On the other hand, if a VAR pulse is detected before a REF pulse, a pulse is outputted by gate 62 on line 66 to other circuitry 68. The RESET line is connected to gates 56 and 74 such that a RESET pulse appears to circuit portions 50 and 70 as a REF and a VAR pulse simultaneously received, thereby resetting the phase difference to zero degrees. For proper reset to be achieved RESET must go to logic "0", and at the same time REF and VAR must be at logic "0".

Figure 4:
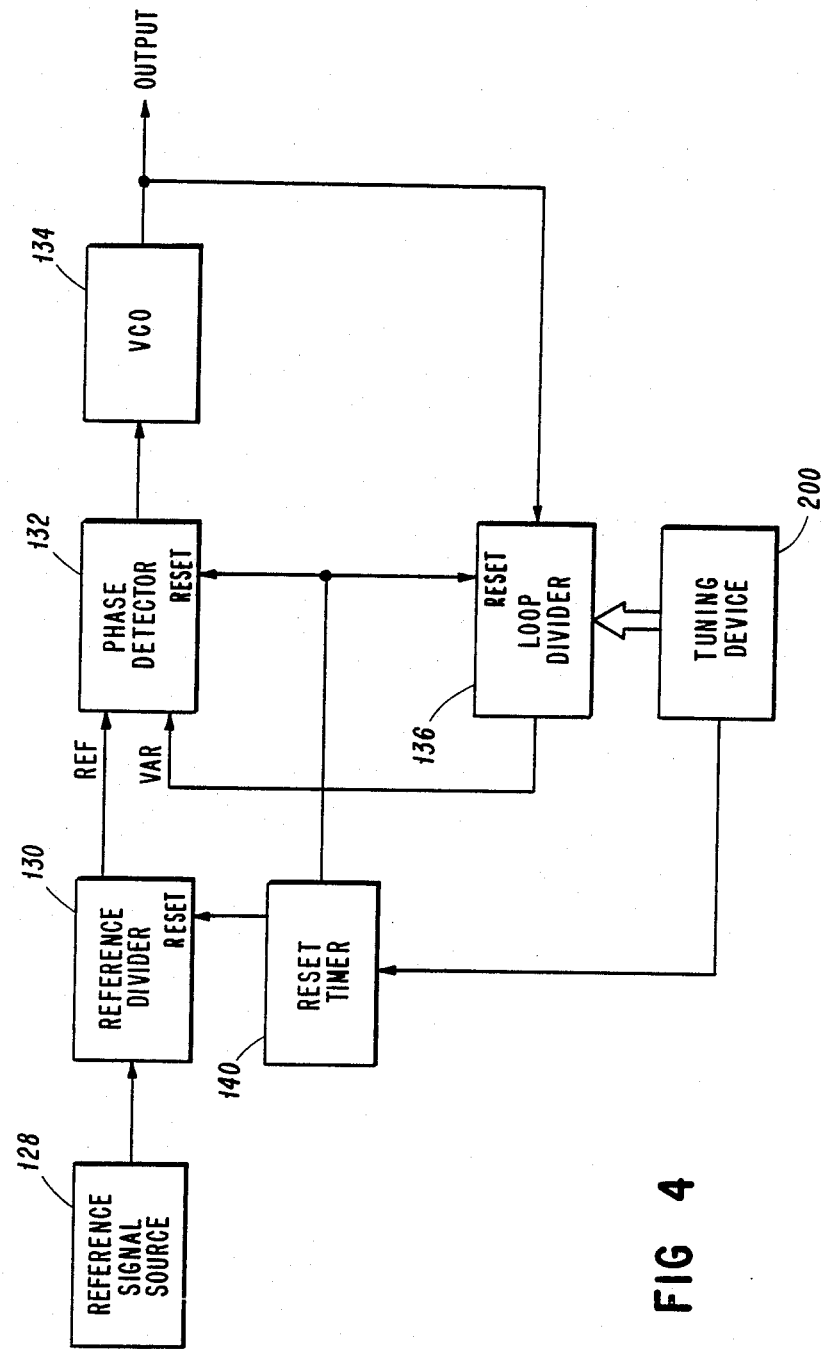
FIG. 4 is a block diagram of a second embodiment of the present invention as used in a tuner in a radio receiver or transmitter.

Referring to FIG. 4, another embodiment of the invention in a single radio system having a fast tune capability is shown. Numbers referring to the same elements as shown in FIG. 2 are given the same reference number with the addition of the 100's digit. The general operation of the phase locked loop of FIG. 4 is the same as described in connection with FIG. 1 except for the omission of reference signal detector 38 and the addition of a tuning device 200 which controls the division ratio in loop divider 136. In this embodiment the tuning device, which may include a microprocessor or a manual tuning knob or switch, changes the divide ratio of loop divider 136, which causes a change in the output frequency of VCO 134. This type of device is typically used to tune a radio transmitter or receiver to a desired frequency. Whenever tuning device 200 is operated, a pulse is sent to reset timer and to the RESET inputs of reference divider 130, loop divider 136, and phase detector 132. This zeroes the count in reference divider 130 and in loop divider 136, and resets the phase detector 132 as previously described in connection with FIG. 2. Thus, each time the frequency of the phase locked loop of FIG. 4 is changed the loop conditions are reset, thereby substantially decreasing the tune time for the loop.

While particular embodiments of the present invention have been shown and described, it should be obvious that minor changes and modifications may be made therein without departing from the true scope and spirit of the invention. It is the intention in the appended claims to cover all such changes and modifications.

I claim:

1. A phase-locked-loop exhibiting a fast response time, comprising:
   a voltage controlled oscillator providing an output signal;
   a phase detector providing an error signal to the voltage controlled oscillator;
   means providing a reference signal to the phase detector;
   counter means for dividing the frequency of the output signal of said voltage controlled oscillator and providing a resulting signal to said phase detector;
   means for detecting the presence of the reference signal;
   means responsive to the detecting means for resetting said counter means to a predetermined count;
   means providing an indication of a frequency change;
   means for providing a preset signal to said phase detector simulating an in-phase relationship between said reference and said variable signals and
   delay means for maintaining application of said reset signal providing means to said phase detector for a predetermined length of time.

2. A phase locked loop exhibiting a fast response time in accordance with claim 1 wherein said means for providing an indication of frequency change comprises a microprocessor.

3. A phase-locked-loop exhibiting a fast response time, comprising:
   a voltage controlled oscillator providing an output signal;
   a phase detector providing an error signal to the voltage controlled oscillator;
   means for selectively providing a reference signal to the phase detector;
   first counter means for dividing the frequency of the output signal of said voltage controlled oscillator and providing a resulting variable signal to said phase detector;
   second counter means for dividing the frequency of said reference signal;
   means for detecting the presence of the reference signal;

means responsive to the detecting means for resetting said first counter means to a predetermined count;

means responsive to said detecting means for resetting said second counter means to a predetermined count; and means responsive to said detecting means for providing a signal to said phase detector simulating an in-phase relationship between said reference and said variable signals.

4. A phase locked loop exhibiting a fast response time in accordance with claim 3 further including delay means for maintaining application of said first and second resetting means to said first and second counter means and of said preset signal providing means to said phase detector for a predetermined length of time.

* * * * *